Figure 1:
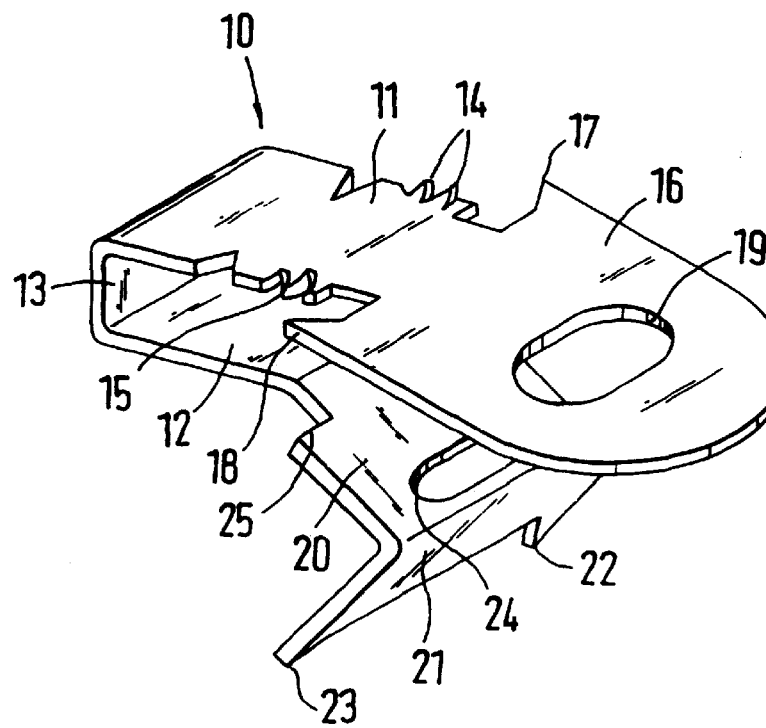

United States Patent
Münch et al.

[11] Patent Number: 6,042,395
[45] Date of Patent: Mar. 28, 2000

[54] SWITCHGEAR CUBICLE WITH FRAME AND CLADDING

[75] Inventors: Udo Münch, Sinn; Markus Neuhof, Ehringshausen-Niederlemp; Wolfgang Reuter, Burbach; Paul Root, Bad Endbach, all of Germany

[73] Assignee: Rittal-Werk Rudolf Loh GmbH & Co. KG, Herborn, Germany

[21] Appl. No.: 08/952,992

[22] PCT Filed: Jul. 1, 1996

[86] PCT No.: PCT/EP96/02861

§ 371 Date: Nov. 18, 1997

§ 102(e) Date: Nov. 18, 1997

[87] PCT Pub. No.: WO97/04631

PCT Pub. Date: Feb. 6, 1997

[30] Foreign Application Priority Data

Oct. 28, 1995 [DE] Germany ............................ 195 40 300

[51] Int. Cl.⁷ ........................................................ H01R 4/66
[52] U.S. Cl. ................................................................ 439/92
[58] Field of Search ...................................... 439/92, 939

[56] References Cited

U.S. PATENT DOCUMENTS 4,879,434 11/1989 Assel et al. .
5,563,450 10/1996 Bader et al. ............................ 257/785

FOREIGN PATENT DOCUMENTS

| 0634550 | 1/1995 | European Pat. Off. . |
| 2702314 | 9/1994 | France . |
| 3344598 | 9/1984 | Germany . |
| 3740496 | 6/1989 | Germany . |
| 8903815 | 6/1989 | Germany . |
| 9310330 | 1/1995 | Germany . |
| 4107747 | 9/1995 | Germany . |
| 8714497 | 1/1998 | Germany . |
| 663509 | 12/1987 | Switzerland . |

Primary Examiner—Michael L. Gellner
Assistant Examiner—Antoine Ngandjui
Attorney, Agent, or Firm—Pauley Petersen Kinne & Fejer

[57] ABSTRACT

A switchgear cubicle with a frame having individual framing sections and/or framing sections folded against cladding components, the open sides of which are covered or can be closed off by cladding components and a door. The framing sections and the cladding components are painted and the framing sections have at least one row of square or rectangular securing apertures on one side directed perpendicularly to the facing cladding component. An electrical connection between the cladding component and the frames is accomplished with U-shaped spring components which are secured in an aperture, supported on the components to be interconnected by spring-loaded claws and penetrate the paint coatings.

20 Claims, 3 Drawing Sheets

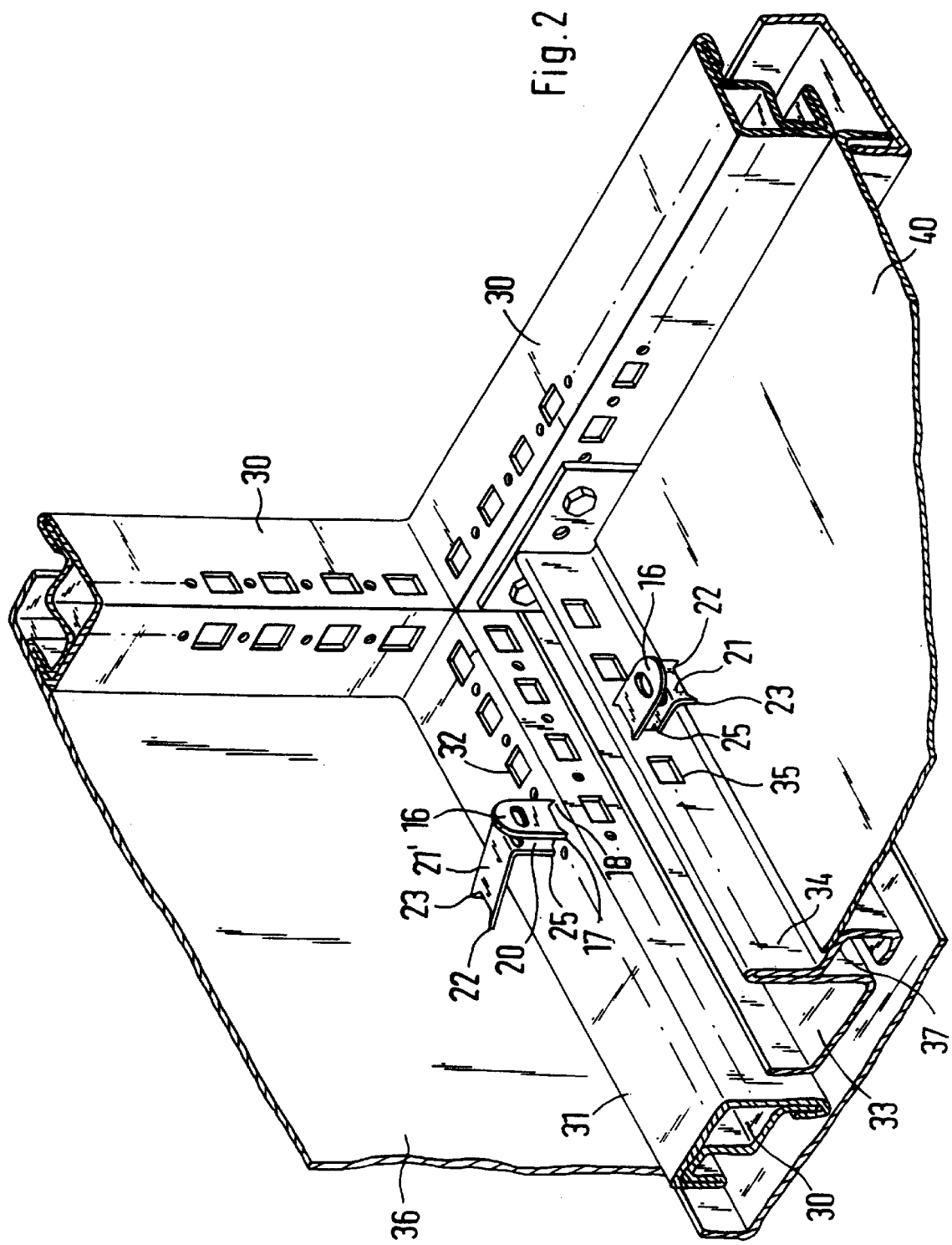

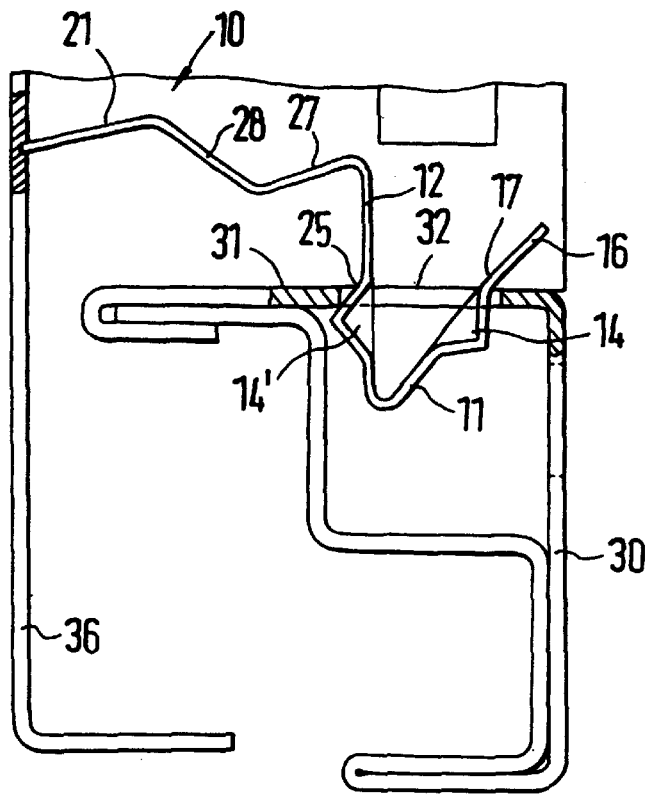
Fig.5
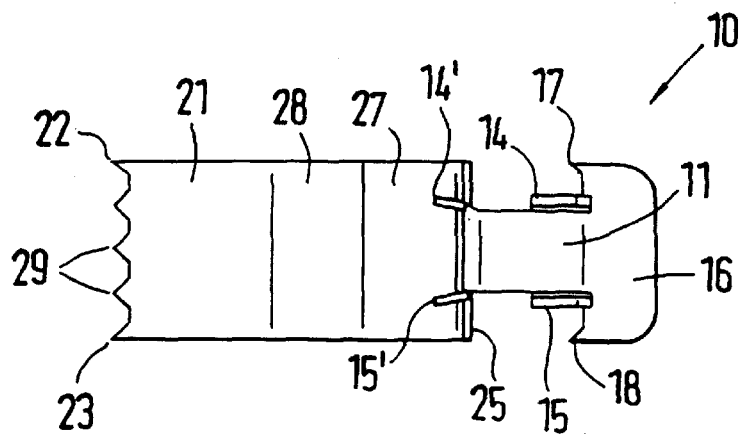
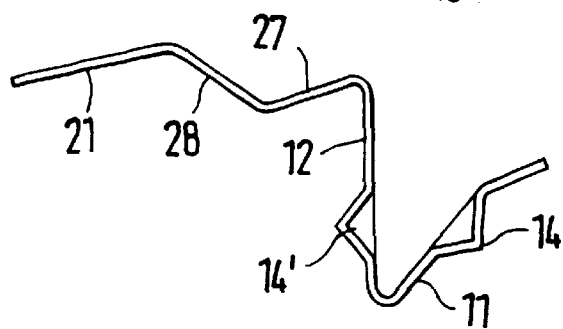
FIG.6

SWITCHGEAR CUBICLE WITH FRAME AND CLADDING

The invention relates to a switchgear cabinet with a rack assembled from individual frame legs and/or from frame legs beveled on panel elements, whose open sides are closed or can be closed off by panel elements and a cabinet door, wherein the frame legs and the panel elements are lacquered, and wherein the frame legs have at least one profile side provided with a row of square or rectangular securing openings, which are aligned vertically in respect to the facing panel element.

A switchgear cabinet of this type is known from DE 33 44 598 C1. There is no direct electrical connection between the lacquered parts of the switchgear cabinet. This is also not positively assured when the elements are bolted together. If this electrical connection between the panel elements and the rack is necessary, these parts are unequivocally electrically connected with each other by means of a grounding strip. To this end, both parts must be provided with appropriate connecting elements, and the application of the grounding strip requires an additional considerable assembly effort.

It is the object of the invention to provide an unequivocal electrical connection between a panel element and the rack, even at a later date, of a switchgear cabinet of the type mentioned at the outset.

In accordance with the invention this object is attained in that for the electrical connection between a frame leg and the facing panel element a U-shaped spring element can be inserted sufficiently far into at least one securing opening of the profile side, so that it is supported under spring tension by holding claws of the one leg on the wall of the securing opening of the profile side, and with end claws of the other leg on the facing side of the panel element.

This spring element can be inserted into any arbitrary securing opening of the profile side of a frame leg, wherein the holding claws of the one leg are clamped in the securing opening and create an electrical contact with the frame leg. The end claws of the other leg are resiliently supported on the panel element. The holding claws and the end claws penetrate the lacquer layer and provide an unequivocal electrical connection between the frame leg and the panel element. Since both legs of the spring element generate a spring tension, a sufficient force for penetrating the lacquer layer is generated.

If in accordance with one embodiment it is provided that the U-shaped spring element has a leg width which is matched to the dimension of the securing opening oriented parallel with the panel element, and that the U-shaped spring element can be inserted into the securing opening with the center leg in front, the spring element cannot be displaced in this direction in the securing opening.

So that the inserted spring element takes up a defined assembly position, it is provided in accordance with an embodiment, that the legs of the U-shaped spring element have angled end sections toward the free ends which are wider and constitute detents for limiting the insertion movement of the spring element into the securing opening of the profile side.

In accordance with one embodiment the bends of the spring element are embodied in such a way that the end section of the leg of the spring element provided with holding claws is positioned approximately vertically in respect to the profile side in its inserted position, and that the end section of the other leg is again angled and with its section provided with the end claws is positioned approximately vertically in respect to the facing panel element.

If it is provided that the profile side is a part of a gliding rail, which is connected with the frame leg, which makes a transition into a support section extending vertically in respect to it, on which a panel element embodied as a bottom panel rests directly or via a sealing element, it is possible in just as simple a way to also connect a bottom panel with the switchgear cabinet in an electrically conducting manner. In this case the embodiment of the spring element is preferably such that the distance between the legs of the spring element is less than the dimension of the securing opening which is oriented vertically in respect to the panel element.

The release of the spring element from the assembly position is performed by a simple finger pressure on the end section of the one leg with the holding claws. The latter can also have an opening for receiving a screwdriver.

The arrangement of the holding claws on the one leg of the spring element is preferably such that the securing claws are formed at both narrow sides of the one leg. In that case the holding claws are clamped on the oppositely located wall of the securing opening.

The electrical connection between the rack and the panel element by means of the spring element can be further improved in that the detents of the legs are embodied as claws.

Figure 3:
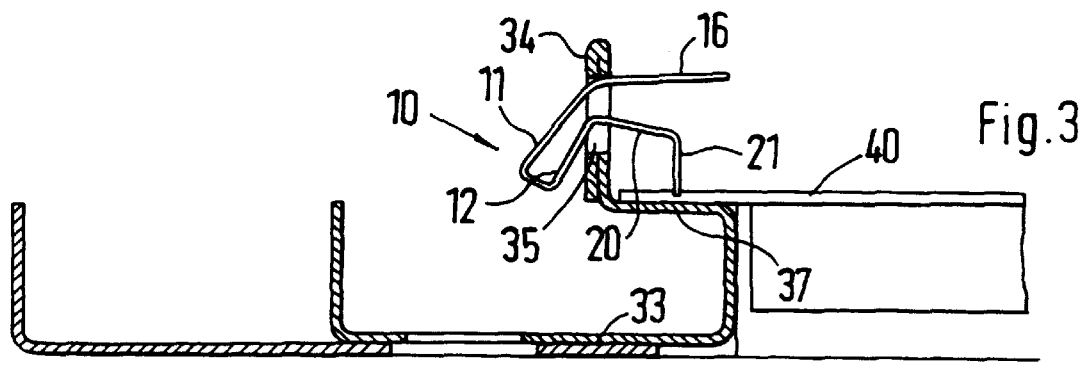
Figure 4:
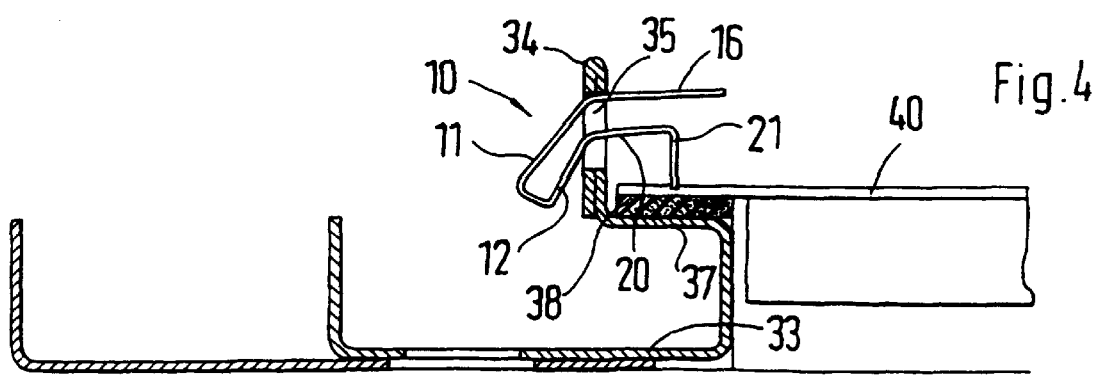

The invention will be explained in more detail by means of exemplary embodiments represented in the drawings. Shown are in:

FIG. 1, a U-shaped spring element for connecting a panel element with the facing frame leg of a rack of a switchgear cabinet in a perspective view, FIG. 2, a partial view of a switchgear cabinet with the electrical connection of a lateral wall and a bottom plate with the rack, FIG. 3, a section through the junction between the bottom plate and the sliding rail, FIG. 4, the junction in accordance with FIG. 3, but with the interposition of a sealing element, FIG. 5, a partial section which shows a different shaping of the spring element, which is particularly suited for improved holding on the frame leg and for a tolerance compensation of the distance between the frame leg and the panel element, and FIG. 6, the spring element used in FIG. 5 in two views.

As FIG. 1 shows, a spring element 10 consisting of a spring steel band is bent into a U-shape with the two legs 11 and 12 and the center leg 13. The width of the legs 11 and 12 is matched to the dimension of square securing openings in a profile side of the frame leg of the rack. The distance between the legs 11 and 12 is less than the dimension of the securing opening, which will be shown later.

The one leg 11 makes a transition into an angled end section 16, which is wider and forms detents 17 and 18 embodied as claws. The end section 16 can in addition be provided with an opening 19 for inserting a screwdriver, and the widened end section 20 of the other leg 12 also. These transitions can also form detents 25 embodied as claws. At the narrow sides of the end section of the leg 11, i.e. shortly before the claw detents 17 and 18, one or several holding claws 14 and 15 are formed, which protrude laterally past the narrow sides and/or the outside of the one leg 11, and which in the course of insertion of the spring element 10 into a securing opening of the frame leg are clamped on the facing walls of the securing openings and penetrate the applied lacquer layer. The end section 20 of the leg 12 is once more angled, as shown by the section 21 terminating in end claws 22 and 23.

As represented in FIG. 2, the spring element 10 is inserted with the center leg 13 in front into a securing opening 32 in a profile side 31 of a frame leg 30 of the rack, which is provided with a row of securing openings, until the detents 17, 18 and 25 of the legs 11 and 12 are in contact with the profile side 31. The profile side 31 of the frame leg 30 extends vertically in respect to the panel element 36 to be attached, which in the exemplary embodiment is a lateral wall. The section 21' is of such a size that the end claws 22 and 23 are supported under spring tension on the facing inside of the panel element 36. The lateral holding claws 14 and 15 are clamped inside the securing opening 32.

The bends of the legs 11 and 12 with the end sections 16 and 20 or 21 are made in such a way that in the assembly position the end section 16 extends approximately vertically in respect to the profile side 31, and the section 21 with the end claws 22 and 23 vertically in respect to the panel element 36.

A bottom plate 40 is electrically connected with a gliding rail 33 in the same way. The gliding rail 33 is connected with a frame leg 30, and a vertically aligned profile side 34 with a row of securing openings constitutes a guide strip for inserting an assembly plate, not represented. The gliding rail 33 has a support section 37 aligned vertically in respect to the profile side 34, on which a panel element 40, embodied as a bottom plate, is placed with or without a sealing element 38, as shown in FIGS. 3 and 4. The spring element 10, inserted into the securing opening 35 of the profile side 34, can adapt itself to the different thickness of the panel element 40 (FIG. 3) and the combined thickness of the panel element 40 and the sealing element 38 (FIG. 4), namely by a reduction of the distance between the legs 11 and 12 or their end sections 16 and 20, 21, without in the process interfering with the function of the holding claws 14 and 15 as well as the end claws 22 and 23. When contacting the panel element 40 embodied as a bottom plate, the section 21 of the spring element 10 is matched to the shorter distance between the securing opening 35 and the panel element 40 embodied as a bottom plate.

As FIG. 2 discloses, the detents 17 and 18, embodied as claws, of the leg 11, and the detents 25, embodied as claws, of the leg 12 are resiliently supported on the profile side 31 or 34 and thereby improve the electrical connection.

As indicated in FIGS. 3 and 4, claws can be stamped or bent out of the leg 11, which are resiliently supported on the parallel wall of the securing opening 35 facing away from the panel element 40, and provide the contact formation.

Making contact between a panel element 36 and a frame leg 30 in accordance with FIG. 2 by means of an improved spring element 10 is shown in FIG. 5 in a partial view and partial section. In this case the two legs 11 and 12, which are inserted into the opening 32 of the profile side 31 of the frame leg 30 until the detents 17 and 18, embodied as claws, at the transition of the one leg 11 to the wider end section 16, and the detents 25, embodied as claws, at the wider end section 21 of the other leg 12 push against the exterior of the profile side 31, are placed at an acute angle to each other. The legs 11 and 12 are matched to the dimension of the opening 32, and on their narrow sides both have holding claws 14 and 15 or 14' and 15', which project past the narrow sides and/or the outsides of the legs 11 and 12. These holding claws 14 and 15 or 14' and 15' extend obliquely, as can be seen in particular from the lower lateral view of FIG. 6. They are embodied approximately triangular and can partially extend behind the facing sides of the opening 32 after the legs 11 and 12 have been locked in, and in this way can improve the retention of the spring element 10 in the opening 32. The leg 12 widens after the holding claws 14' and 15' of the leg 12 and forms detents 25, acting as claws, which are supported on the profile side 31 of the frame leg 30 and penetrate the lacquer layer.

The widened leg 12 makes a direct transition into the section 21, which terminates at the end claws 22 and 23 supported on the panel element 36. In order to achieve an improved provision of contact, the end section between the end claws 22 and 23 is embodied in a sawtooth-like manner, as indicated by the reference numeral 29. So that the support on the panel element 36 itself is resilient, and to compensate for tolerances in the distance between the frame leg 30 and the panel element 36, the end section 21 itself is beveled in a Z-shape, so that it can be resilient in itself, as indicated by the bends 27 and 28. In this way a sufficient pressure between the end section 21 and the panel element 36 is generated, even with a tolerance compensation, which in any case is sufficient for penetrating the lacquer layer and providing an unequivocal contact.

We claim:

1. In a switchgear cabinet with a rack assembled from one of individual frame legs and frame legs beveled on panel elements, with open sides that can be closed off by at least one of panel elements and a cabinet door, wherein the frame legs and the panel elements are lacquered, and wherein the frame legs have at least one profile side with a row of rectangular securing openings, which are aligned vertically in respect to a facing panel element of the panel elements, the improvement comprising:

an electrical connection between a frame leg (30, 33) and the facing panel element (36, 40) formed by a U-shaped spring element (10) having spring forces directed to the outside of two legs (11, 12), the U-shaped spring element insertable into at least one of the securing openings (32, 35) of the profile side (31, 34), the U-shaped spring element (10) supported under spring tension by a plurality of holding claws (14, 15) positioned along an outside of the one leg (11) and engaging the wall of the securing opening (32, 35) of the profile side (31, 34) and by a plurality of end claws (22, 23) of the other leg (12) on the facing side of the panel element (36, 40).

2. In a switchgear cabinet in accordance with claim 1, wherein the legs (11, 12) of the U-shaped spring element (10) have a plurality of angled end sections (16, 20, 21) toward a free end of each of the legs (11, 12) which is wider and forms a plurality of detents (17, 18, 25) for limiting insertion movement of the spring element (10) into the securing opening (32, 35) of the profile side (31, 34).

3. In the switchgear cabinet in accordance with claim 1, wherein one end section (16) of the angled end sections (16, 20, 21) of the leg (11) of the spring element (10) has a plurality of holding claws (14, 15) positioned approximately vertically witf respect to the profile side (31, 34) in an inserted position, and a second end section (20) of the angled end sections (16, 20, 21) of the other leg (12) is angled and a third end section (21) of the angled end sections (16, 20, 21) has the end claws (22, 23) positioned approximately vertically with respect to the facing panel element (36, 40).

4. In the switchgear cabinet in accordance with claim 1, wherein the profile side (34) is a part of a gliding rail (33) which is connected with the frame leg (30) which makes a transition into a support section (37) on which a panel element (40) rests.

5. In the switchgear cabinet in accordance with claim 1, wherein
at least the end section (16) of the one leg (11) with the holding claws (14, 15) has an opening (25) for receiving a screwdriver.

6. In the switchgear cabinet in accordance with claim 1, wherein
the holding claws (14, 15) are formed on both narrow sides of the one leg (11) and laterally project past at least one of the narrow sides and an outside of the one leg (11).

7. In the switchgear cabinet in accordance with claim 1, wherein
the two legs (11, 12) of the spring element (10) are oriented at an acute angle with respect to each other,
the holding claws (14, 15) are approximately triangular and partially extend behind the opening (32) in the profile side (31) of the frame leg (30), and
the other leg (12) has a plurality of holding claws (14', 15') which partially project past at least one of the narrow sides and the outside of the other leg (12) and which partially extend behind the opening (32) in the profile side (31) of the frame leg (30) on an oppositely located side of the opening.

8. In the switchgear cabinet in accordance with claim 1, wherein
the leg (12) makes a direct transition into the section (21) and is angled approximately in a shape of a letter Z and is resiliently supported on the facing side of the panel element (36).

9. In a switchgear cabinet in accordance with claim 1, wherein
the leg (12) is formed in a sawtooth (29) manner in an area between the end claws (22, 23).

10. In the switchgear cabinet in accordance with claim 1, wherein
the U-shaped spring element (10) has a leg width matched to a dimension of the securing opening (32, 35) which is oriented parallel to the panel element (36, 40), and
a center leg (13) of the U-shaped spring element (10) insertable into the securing opening (32, 35).

11. In a switchgear cabinet in accordance with claim 10, wherein
the legs (11, 12) of the U-shaped spring element (10) have a plurality of angled end sections (16, 20, 21) toward a free end of each of the legs (11, 12) which is wider and forms a plurality of detents (17, 18, 25) for limiting insertion movement of the spring element (10) into the securing opening (32, 35) of the profile side (31, 34).

12. In the switchgear cabinet in accordance with claim 11, wherein
one end section (16) of the angled end sections (16, 20, 21) of the leg (11) of the spring element (10) has a plurality of holding claws (14, 15) positioned approximately vertically with respect to the profile side (31, 34) in an inserted position, and a second end section (20) of the angled end sections (16, 20, 21) of the other leg (12) is angled and a third end section (21) of the angled end sections (16, 20, 21) has the end claws (22, 23) positioned approximately vertically with respect to the facing panel element (36, 40).

13. In the switchgear cabinet in accordance with claim 12, wherein
the profile side (34) is a part of a gliding rail (33) which is connected with the frame leg (30) which makes a transition into a support section (37) on which a panel element (40) rests.

14. In the switchgear cabinet in accordance with claim 13, wherein
at least the end section (16) of the one leg (11) with the holding claws (14, 15) has an opening (25) for receiving a screwdriver.

15. In the switchgear cabinet in accordance with claim 13,
wherein a distance between the legs (11, 12) of the spring element (10) is less than the dimension of the securing opening (31, 35) oriented vertically with respect to the panel element (36, 40).

16. In the switchgear cabinet in accordance with claim 15, wherein
the holding claws (14, 15) are formed on both narrow sides of the one leg (11) and laterally project past at least one of the narrow sides and an outside of the one leg (11).

17. In the switchgear cabinet in accordance with claim 16, wherein
the detents (17, 18) of the legs (11, 12) are embodied as claws.

18. In the switchgear cabinet in accordance with claim 17, wherein
the two legs (11, 12) of the spring element (10) are oriented at an acute angle with respect to each other,
the holding claws (14, 15) are approximately triangular and partially extend behind the opening (32) in the profile side (31) of the frame leg (30), and
the other leg (12) has a plurality of holding claws (14', 15') which partially project past at least one of the narrow sides and the outside of the other leg (12) and which partially extend behind the opening (32) in the profile side (31) of the frame leg (30) on an oppositely located side of the opening.

19. In the switchgear cabinet in accordance with claim 12, wherein
the other leg (12) makes a direct transition into the section (21) and is angled approximately in a shape of a letter Z and is resiliently supported on the facing side of the panel element (36).

20. In a switchgear cabinet in accordance with claim 19, wherein
the other leg (12) is formed in a sawtooth (29) manner in an area between the end claws (22, 23).

* * * * *

UNITED STATES PATENT AND TRADEMARK OFFICE
CERTIFICATE OF CORRECTION

PATENT NO. : 6,042,395
DATED : March 28, 2000
INVENTOR(S) : Udo Munch et al.

It is certified that error appears in the above-identified patent and that said Letters Patent is hereby corrected as shown below:

On cover page, after "[30] Foreign Application Priority Data" please insert:

--Jul. 15, 1995 [DE] Germany ...... 195 25 879.7--

Signed and Sealed this

Twenty-seventh Day of February, 2001

Attest:

NICHOLAS P. GODICI

Attesting Officer    Acting Director of the United States Patent and Trademark Office